US006218203B1

(12) United States Patent
Khoury et al.

(10) Patent No.: US 6,218,203 B1
(45) Date of Patent: Apr. 17, 2001

(54) METHOD OF PRODUCING A CONTACT STRUCTURE

(75) Inventors: Theodore A. Khoury; James W. Frame, both of Chicago, IL (US)

(73) Assignee: Advantest Corp., Tokyo (JP)

( * ) Notice: Subject to any disclaimer, the term of this patent is extended or adjusted under 35 U.S.C. 154(b) by 0 days.

(21) Appl. No.: 09/344,851

(22) Filed: Jun. 28, 1999

(51) Int. Cl.$^7$ .................................................. G01R 31/26
(52) U.S. Cl. ......................... 438/15; 438/613; 438/617; 438/800
(58) Field of Search .................................. 438/613, 617, 438/15, 800

(56) References Cited

U.S. PATENT DOCUMENTS 5,296,782 * 3/1994 Sawai .

6,103,553 * 8/2000 Park .

* cited by examiner

Primary Examiner—John F. Niebling
Assistant Examiner—Josetta Jones
(74) Attorney, Agent, or Firm—Muramatsu & Associates

(57) ABSTRACT

A method of producing a contact structure for achieving an electrical connection with a contact target. The contact structure includes a contactor formed on a planar surface of a substrate by a microfabrication technology. In one aspect, the production method involves a plastic molding technology. In another aspect, the production method involves a photolithography technology using a gray-tone photomask. The contactor has at least a horizontal portion formed on the substrate and a contact portion formed on one end of the horizontal portion. A spring force of the horizontal portion of the contactor provides a contact force when the contactor is pressed against the contact target. In a further aspect, the contact structure includes a recess for providing a free space for the contactor when the contactor is pressed against the contact target.

18 Claims, 15 Drawing Sheets

Fig. 3
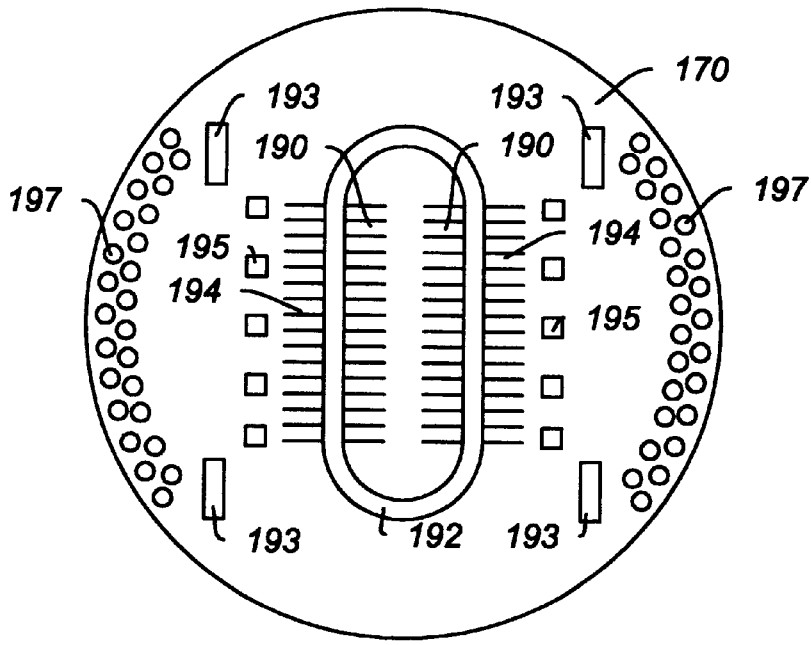
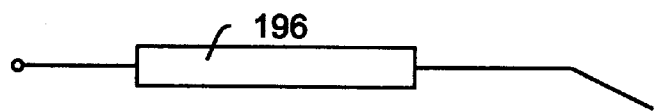
Fig. 4A
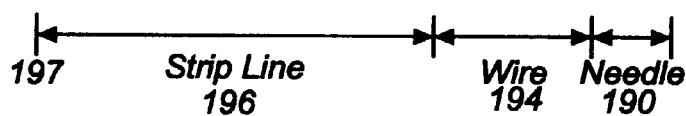
Fig. 4B
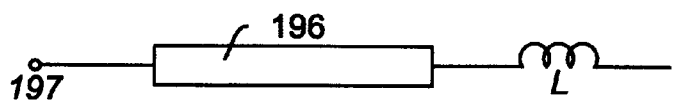
Fig. 4C
Fig. 4D
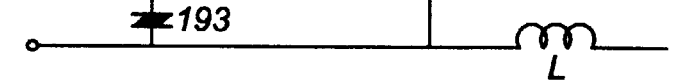
Fig. 4E

METHOD OF PRODUCING A CONTACT STRUCTURE

FIELD OF THE INVENTION

This invention relates to a method of producing a contact structure to establish electrical contact with contact targets such as contact pads or leads of electronic circuits or devices, and more particularly, to a method of producing a contact structure to be used in a probe card to test semiconductor wafers, semiconductor chips, packaged semiconductor devices or printed circuit boards and the like with an improved frequency bandwidth, pin pitch and contact performance and reliability.

BACKGROUND OF THE INVENTION

In testing high density and high speed electrical devices such as LSI and VLSI circuits, high performance contact structures, such as probe contactors or test contactors, must be used. The contact structure of the present invention is not limited to the application of testing and burn-in of semiconductor wafers and die, but is inclusive of testing and burn-in of packaged semiconductor devices, printed circuit boards and the like. The contact structure of the present invention can also be used in more general applications including an IC lead, IC packaging, and other electrical connections. However, for the convenience of explanation, the present invention is described mainly with reference to the semiconductor wafer testing.

In the case where semiconductor devices to be tested are in the form of a semiconductor wafer, a semiconductor test system such as an IC tester is usually connected to a substrate handler, such as an automatic wafer prober, to automatically test the semiconductor wafer. Such an example is shown in FIG. 1 in which a semiconductor test system has a test head which is ordinarily in a separate housing and electrically connected to the test system with a bundle of cables. The test head and the substrate handler are mechanically as well as electrically connected with one another. The semiconductor wafers to be tested are automatically provided to a test position of the test head by the substrate handler.

On the test head, the semiconductor wafer to be tested is provided with test signals generated by the semiconductor test system. The resultant output signals from the semiconductor wafer under test (IC circuits formed on the semiconductor wafer) are transmitted to the semiconductor test system. In the semiconductor test system, the output signals are compared with expected data to determine whether the IC circuits on the semiconductor wafer function correctly.

In FIG. 1, the test head 100 and the substrate handler 400 are connected through an interface component 140 consisting of a performance board 120 which is a printed circuit board having electric circuit connections unique to a test head's electrical footprint, coaxial cables, pogo-pins and connectors. In FIG. 2, the test head 100 includes a large number of printed circuit boards 150 which correspond to the number of test channels (pins) of the semiconductor test system. Each of the printed circuit boards 150 has a connector 160 to receive a corresponding contact terminal 121 of the performance board 120. A "frog" ring 130 is mounted on the performance board 120 to accurately determine the contact position relative to the substrate handler 400. The frog ring 130 has a large number of contact pins 141, such as ZIF connectors or pogo-pins, connected to contact terminals 121, through coaxial cables 124.

As shown in FIGS. 1 and 2, the test head 100 is placed over the substrate handler 400 and mechanically and electrically connected to the substrate handler through the interface component 140. Typically, the movement of the test head 100 relative to the substrate handler 400 is assisted by a manipulator 500 having a motor 510 therein. In the substrate handler 400, a semiconductor wafer 300 to be tested is mounted on a chuck 180. In this example, a probe card 170 is provided above the semiconductor wafer 300 to be tested. The probe card 170 has a large number of probe contactors (such as cantilevers or needles) 190 to contact with contact targets such as circuit terminals or contact pads in the IC circuit on the semiconductor wafer 300 under test.

Electrical terminals or contact receptacles of the probe card 170 are electrically connected to the contact pins 141 provided on the frog ring 130. The contact pins 141 are also connected to the contact terminals 121 of the performance board 120 with coaxial cables 124 where each contact terminal 121 is connected to the printed circuit board 150 of the test head 100. Further, the printed circuit boards 150 are connected to the semiconductor test system through the cable 110 having several hundreds of inner cables.

Under this arrangement, the probe contactors 190 contact the surface (contact targets) of the semiconductor wafer 300 on the chuck 180 to apply test signals to the semiconductor wafer 300 and receive the resultant output signals from the wafer 300. The resultant output signals from the semiconductor wafer 300 under test are compared with the expected data generated by the semiconductor test system to determine whether the IC circuits on the semiconductor wafer 300 performs properly.

FIG. 3 is a bottom view of the probe card 170 of FIG. 2. In this example, the probe card 170 has an epoxy ring on which a plurality of probe contactors 190 called needles or cantilevers are mounted. When the chuck 180 mounting the semiconductor wafer 300 moves upward in FIG. 2, the tips of the cantilevers 190 contact the pads or bumps (contact targets) on the wafer 300. The ends of the cantilevers 190 are connected to wires 194 which are further connected to transmission lines (not shown) formed in the probe card 170. The transmission lines are connected to a plurality of electrodes 197 which further contact the pogo pins 141 of FIG. 2.

Typically, the probe card 170 is structured by a multi-layer of polyimide substrates having ground planes, power planes, signal transmission lines on many layers. As is well known in the art, each of the signal transmission lines is designed to have a characteristic impedance such as 50 ohms by balancing the distributed parameters, i.e., dielectric constant and magnetic permeability of the polyimide, inductances and capacitances of the signal paths within the probe card 170. Thus, the signal lines are impedance matched lines establishing a high frequency transmission bandwidth to the wafer 300 for supplying currents in a steady state as well as high current peaks generated by the device's outputs switching in a transient state. For removing noise, capacitors 193 and 195 are provided on the probe card between the power and ground planes.

An equivalent circuit of the probe card 170 is shown in FIG. 4 to explain the limitation of the high frequency performance in the conventional probe card technology. As shown in FIGS. 4A and 4B, the signal transmission line on the probe card 170 extends from the electrode 197, the strip (impedance matched) line 196, the wire 194 and the needle or cantilever (contact structure) 190. Since the wire 194 and needle 190 are not impedance matched, these portions function as an inductor L in the high frequency band as shown in FIG. 4C. Because of the overall length of the wire 194 and needle 190 is around 20–30 mm, significant limitations will be resulted from the inductor when testing a high frequency performance of a device under test.

Other factors which limit the frequency bandwidth in the probe card 170 reside in the power and ground needles shown in FIGS. 4D and 4E. If the power line can provide large enough currents to the device under test, it will not seriously limit the operational bandwidth in testing the device. However, because the series connected wire 194 and needle 190 for supplying the power (FIG. 4D) as well as the series connected wire 194 and needle 190 for grounding the power and signals (FIG. 4E) are equivalent to inductors, the high speed current flow is seriously restricted.

Moreover, the capacitors 193 and 195 are provided between the power line and the ground line to secure a proper performance of the device under test by filtering out the noise or surge pulses on the power lines. The capacitors 193 have a relatively large value such as 10 $\mu$F and can be disconnected from the power lines by switches if necessary. The capacitors 195 have a relatively small capacitance value such as 0.01 $\mu$F and fixedly connected close to the DUT. These capacitors serve the function as high frequency decoupling on the power lines. In other words, the capacitors limit the high frequency performance of the probe contactor.

Accordingly, the most widely used probe contactors as noted above are limited to the frequency bandwidth of approximately 200 MHz which is insufficient to test recent semiconductor devices. In the industry, it is considered that the frequency bandwidth comparable to the tester's capability, which is currently on the order of 1 GHz or higher, will be necessary in the near future. Further, it is desired in the industry that a probe card is capable of handling a large number of semiconductor devices, especially memories, such as 32 or more, in a parallel fashion to increase test throughput.

In the conventional technology, the probe card and probe contactors such as shown in FIG. 3 are manually made, resulting in inconsistent quality. Such inconsistent quality includes fluctuations of size, frequency bandwidth, contact forces and resistance, etc. In the conventional probe contactors, another factor making the contact performance unreliable is a temperature change under which the probe contactors and the semiconductor wafer under test have different temperature expansion ratios. Thus, under the varying temperature, the contact positions therebetween vary which adversely affects the contact force, contact resistance and bandwidth.

The inventors of this invention have proposed new types of contact structures in U.S. patent application Ser. No. 09/099,614 filed Jun. 19, 1999 and U.S. patent application Ser. No. 09/303,475 filed Apr. 30, 1999 to solve the problems involved in the conventional technology. There are various methods of producing such contact structures that are not disclosed in the above noted patent applications.

SUMMARY OF THE INVENTION

Therefore, it is an object of the present invention to provide a method of producing a contact structure for electrically contacting a contact target which is capable of achieving a high frequency bandwidth, high pin counts and high contact performance as well as high reliability.

It is another object of the present invention to provide a method of producing a contact structure such as a probe contactor to establish electrical connection in applications such as testing semiconductor devices and the like, having a very high frequency bandwidth to meet the test requirements in the next generation semiconductor technology.

It is a further object of the present invention to provide a method of producing a contact structure to establish electrical connection in applications such as testing semiconductor devices, which are suitable for testing a large number of semiconductor devices in parallel at the same time.

It is a further object of the present invention to a method of producing a contact structure to establish electrical connection in testing semiconductor devices, which are produced through a semiconductor production process without involving manual assembly or handling, thereby achieving consistent quality.

It is a further object of the present invention to provide a method of producing a contact structure through a plastic molding (hot embossing) process for establishing electrical connection in testing semiconductor devices.

It is a further object of the present invention to provide a method of producing a contact structure through a photolithography process using a gray-tone photomask for establishing electrical connection in testing semiconductor devices.

It is a further object of the present invention to provide a method of producing a contact structure to be mounted on a probe card for testing semiconductor devices which are capable of compensating temperature expansion coefficient of a semiconductor wafer under test.

In the present invention, a contact structure for establishing an electrical connection with a contact target is formed by a substrate of a planar surface on which a contactor is created by a microfabrication process using a plastic molding technology or a photolithography technology incorporating a gray-tone photomask.

In one aspect of the present invention, the method of producing a contact structure having a contactor involves the plastic molding process. The production method is comprised of: providing a substrate having a planar surface thereon; forming a plastic layer on the planar surface of the substrate; positioning a mold insert over the plastic layer wherein the mold insert has a shape representing at least a part of the contactor to be formed on the substrate; pressing the mold insert into the plastic layer in a high temperature environment; removing the mold insert from the plastic layer in a low temperature environment to form a plating pattern transferred from the mold insert on the plastic layer; electroplating the plating pattern on the plastic layer to form the contactor; repeating the steps of mold insert pressing and removing for other mold insert for forming a remaining portion of the contactor; and removing one or more plastic layers from the substrate; wherein the contactor has a horizontal portion and a contact portion vertically formed on one end of the horizontal portion, and the horizontal portion produces a contact force when the contactor is pressed against the contact target.

In another aspect of the present invention, the method of producing a contact structure having a contactor involves the photolithography process using a gray-tone photomask. The production method is comprised of: providing a substrate having a planar surface thereon; forming a photoresist layer on the planar surface of the substrate; positioning a photomask over the photoresist layer wherein the photomask has a pattern representing at least a part of the contactor expressed by transparent portions, opaque portions and semi-transparent portions; exposing the photoresist layer with light and removing uncured parts of the photoresist to form a plating pattern on the photoresist layer transferred from the photomask; electroplating the plating pattern on the photoresist layer to form the contactor; repeating the above procedure for forming a remaining part of the contactor; and removing one or more photoresist layers from the substrate; wherein the contactor has a horizontal portion and a contact portion vertically formed on one end of the horizontal portion, and the horizontal portion produces a contact force when the contactor is pressed against the contact target.

According to the present invention, the contact structure has a very high frequency bandwidth to meet the test requirements of next generation semiconductor technology. Since the contact structure is formed through a modern miniaturization technology used in the semiconductor production process, a large number of contactors can be aligned in a small space which is suitable for testing a large number of semiconductor devices at the same time. The contact structure of the present invention can also be used in more general applications including an IC lead, IC packaging, and other electrical connections.

Since the large number of contactors are produced at the same time on the substrate with the use of the microfabrication technology without involving manual handling, it is possible to achieve consistent quality, high reliability and long life in the contact performance. Further, because the contactors can be fabricated on the same substrate material as that of the device under test, it is possible to compensate the temperature expansion coefficient of the device under test, which is able to avoid positional errors.

BRIEF DESCRIPTION OF THE DRAWINGS

FIG. 3 is a bottom view showing an example of the probe card having an epoxy ring for mounting a plurality of probe contactors (needles or cantilevers) in the conventional technology.

FIGS. 4A–4E are circuit diagrams showing equivalent circuits of the probe card of FIG. 3.

DETAILED DESCRIPTION OF THE PREFERRED EMBODIMENT

Figure 7A:
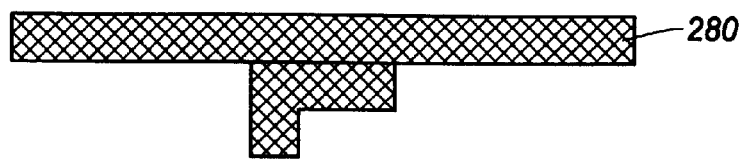
FIGS. 7A–7M are schematic diagrams showing an example of production process using a plastic molding technology for forming the contact structure of FIGS. 5 and 6 in the present invention.
Figure 7B:
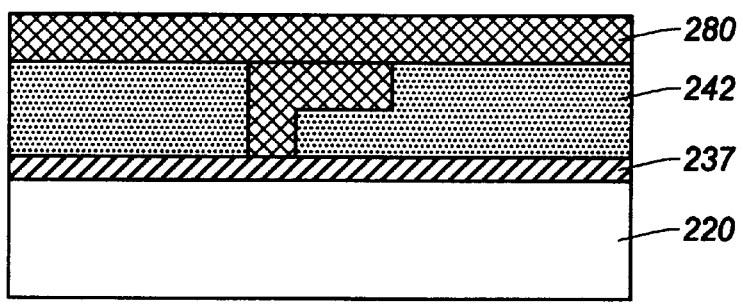
Figure 7C:
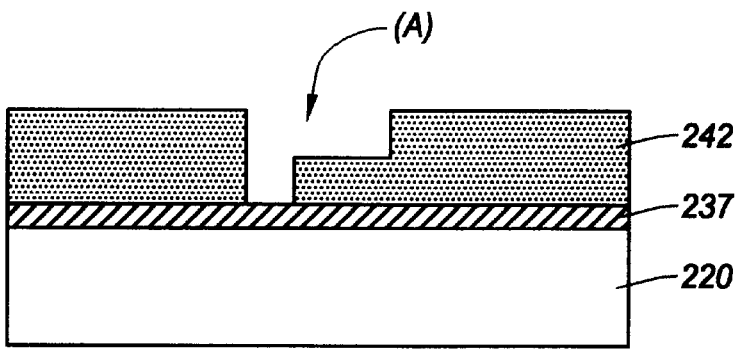
Figure 7D:
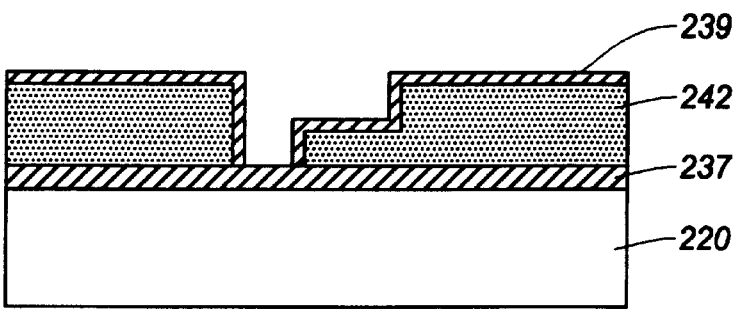
Figure 7E:
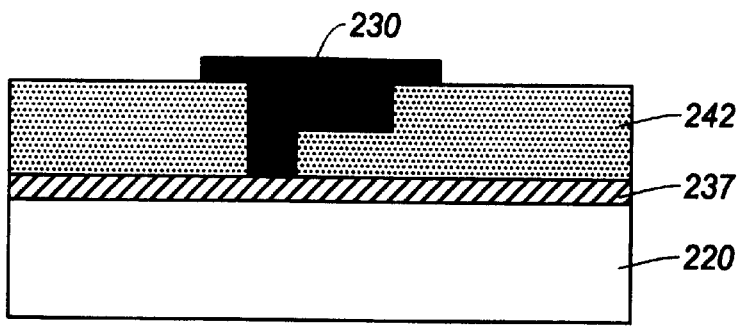
Figure 7F:
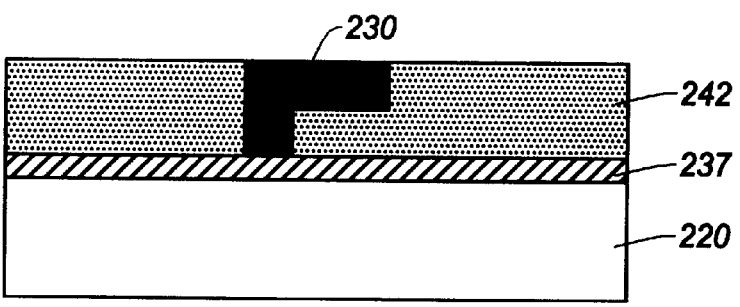
Figure 7G:
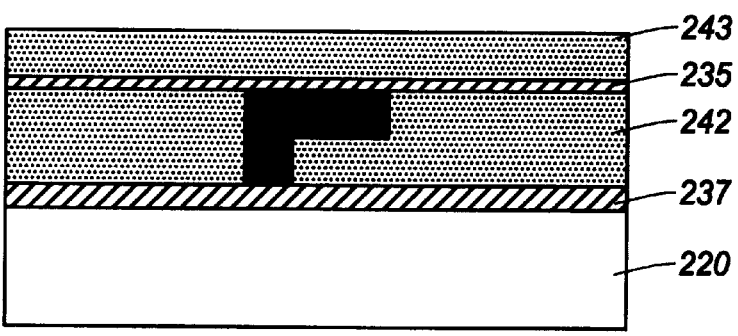
Figure 7H:
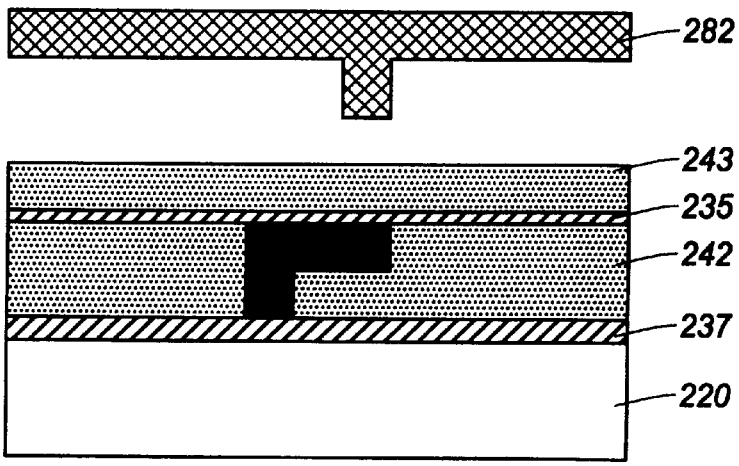
Figure 7I:
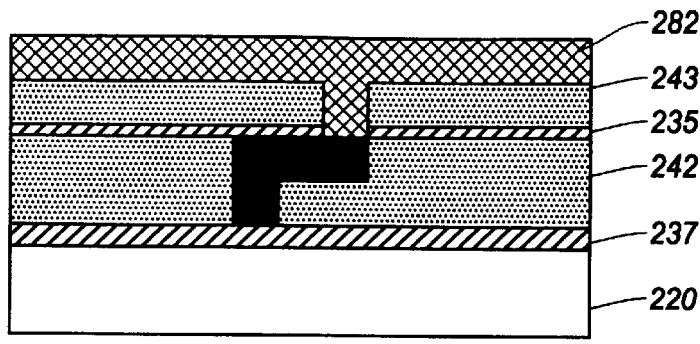
Figure 7J:
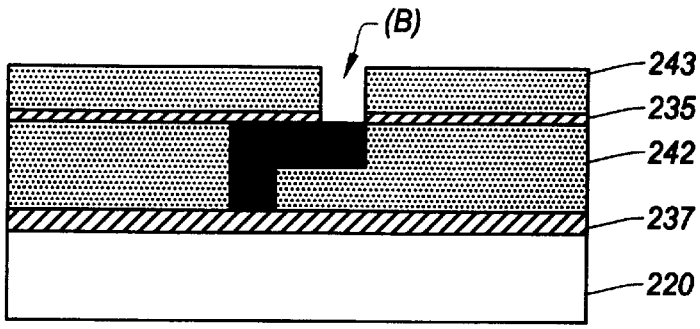
Figure 7K:
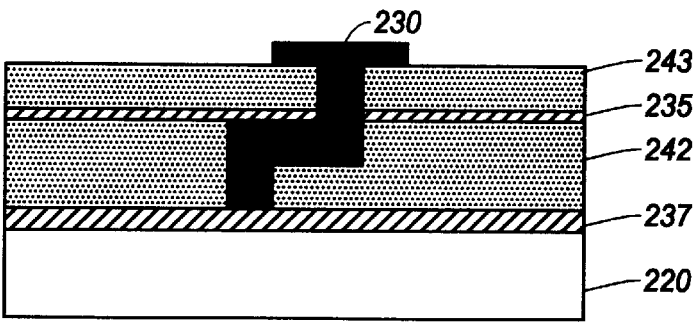
Figure 7L:
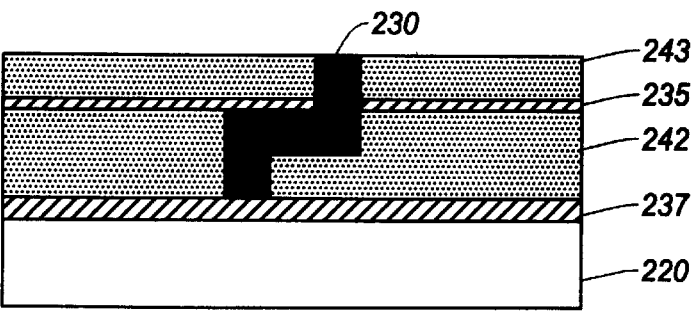
Figure 7M:
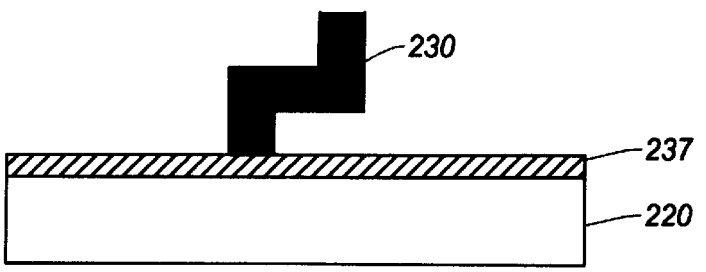
Figure 8A:
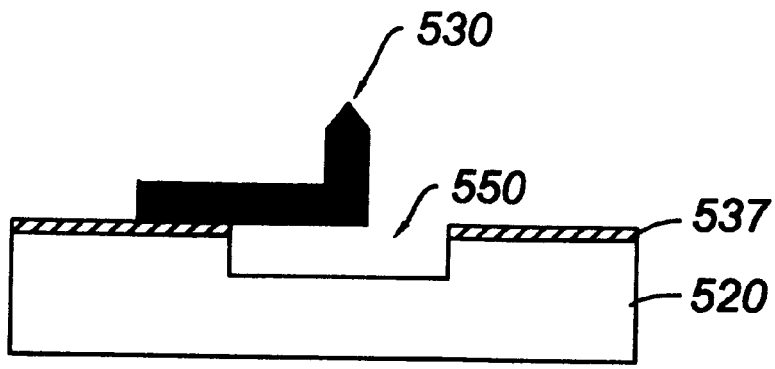
FIGS. 8A and 8B are schematic diagrams showing further examples of contact structures formed on substrates according to the present invention.
Figure 8B:
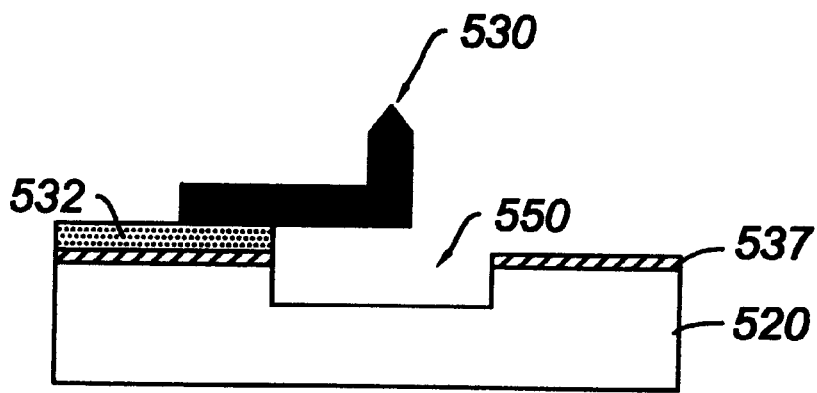

The first example of the contact structure of the present invention is shown in FIGS. 5 and 6A–6C, and the second example of the contact structure of the present invention is shown in FIGS. 8A and 8B. The production processes of the first example of the contact structure are shown in FIGS. 7A–7M and 10A–10G, and the production processes of the second example of the contact structure are shown in FIG. 9A–9N and 11A–11E.

Figure 1:
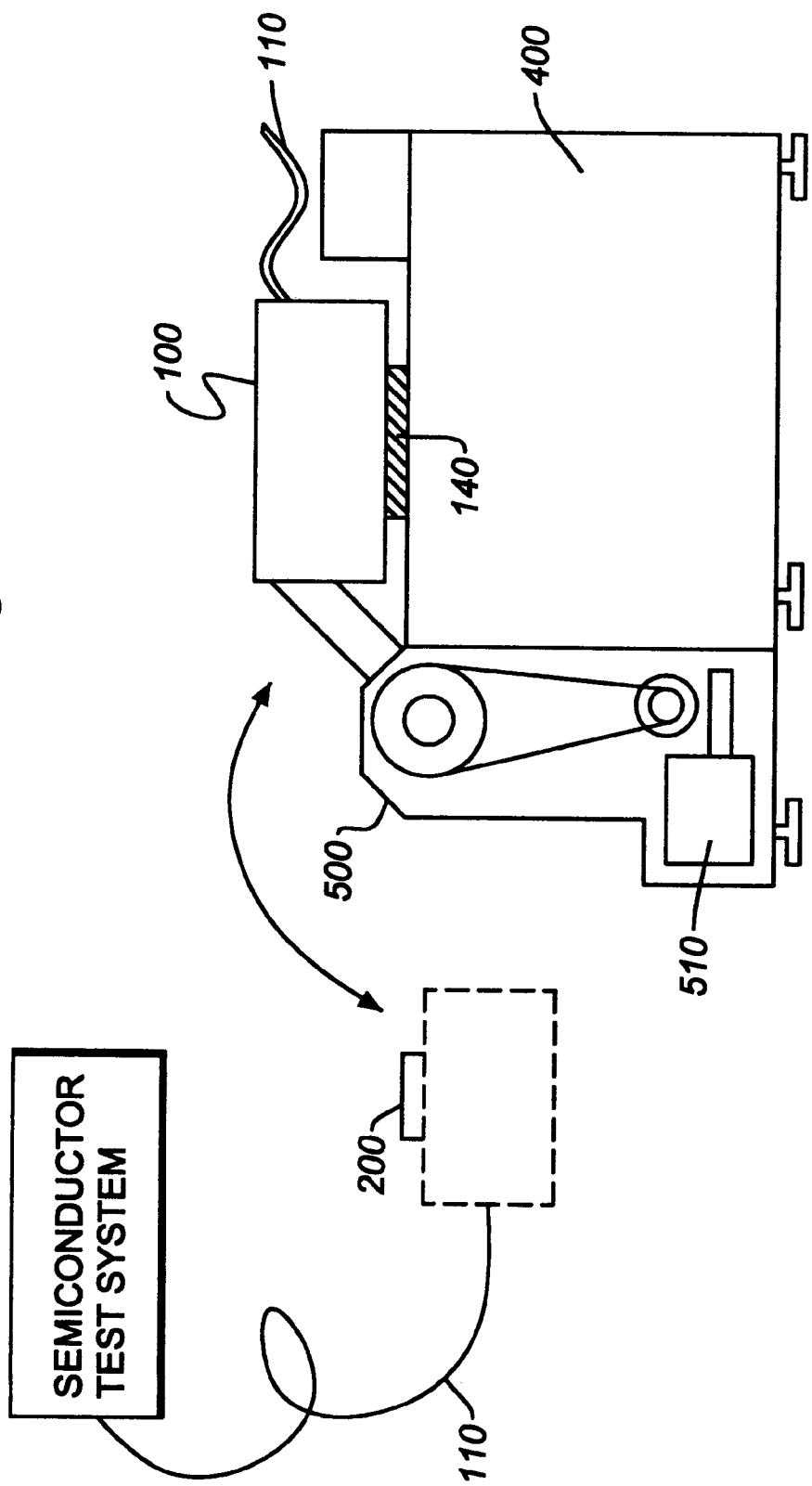
FIG. 1 is a schematic diagram showing a structural relationship between a substrate handler and a semiconductor test system having a test head.
Figure 2:
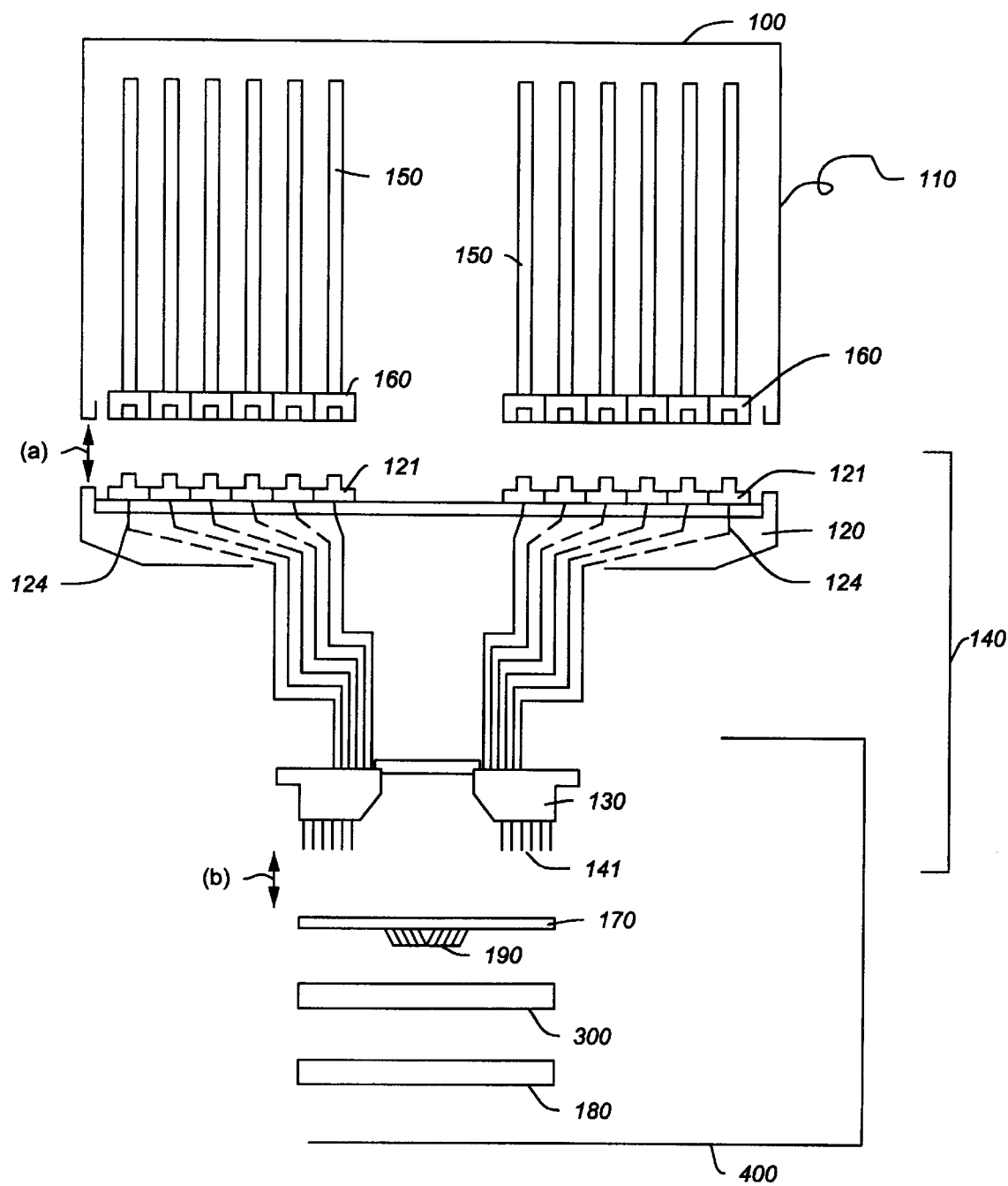
FIG. 2 is a diagram showing an example of a more detailed structure for connecting the test head of the semiconductor test system to the substrate handler through an interface component.
Figure 5:
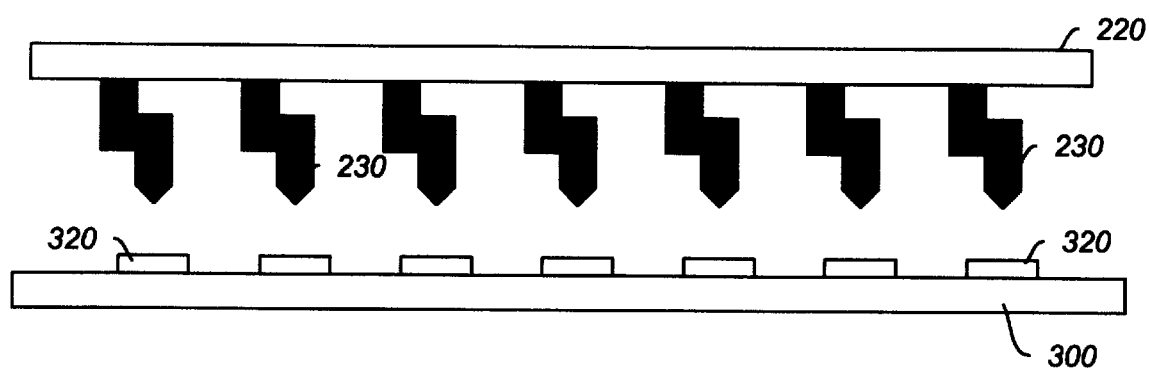
FIG. 5 is a schematic diagram showing contact structures of the present invention produced through a microfabrication process.

With respect to the first example, FIG. 5 shows a contact structure having a plurality of contactors 230 formed on a substrate 220 which is typically a silicon substrate. Other materials such as glass fiber, ceramic, alumina or other dielectric materials are also feasible for the substrate. All of the contactors 230 are produced through the same production processes on the silicon substrate 220 at the same time. Such a semiconductor production process includes a photolithography process, a micro-machining process, a plastic molding process (hot embossing), and the like.

When the semiconductor wafer 300 under test moves upward, the contactors 230 contact corresponding contact targets (electrodes or contact pads) 320 on the wafer 300 to be tested. The pitch between the contact pads 320 may be as small as 50 μm or less. The contactors 230 of the present invention can easily be aligned in the same pitch since the contactors are made by the same semiconductor production process as the wafer 300 are made.

The contactors 230 on the silicon substrate 220 can be directly mounted on a probe card such as shown in FIG. 3, or molded in a package, such as a traditional IC package having leads, so that the package is mounted on a probe card. Since the contactors 230 can be fabricated in a very small size, a frequency bandwidth of a probe card mounting the contactors of the present invention can be easily increased to 2 GHz or higher. Because of the small size, the number of contactors on a probe card can be increased to, for example 2,000, which is able to test as many as 32 or more memory devices in parallel at the same time.

Furthermore, because the contactors 230 of the present invention are formed on the silicon substrate 220, environmental changes such as a temperature expansion ratio of the silicon substrate are the same as those of the semiconductor wafer 300 under test. Therefore, the accurate positioning between the contactors 230 and the pads 320 can be maintained throughout the test.

Figure 6A:
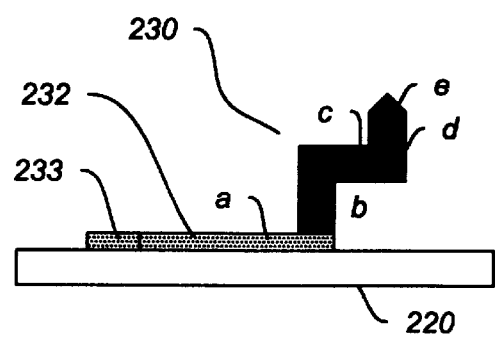
FIGS. 6A–6C are schematic diagrams showing examples of structure of the contact structure of the present invention formed on a substrate.
Figure 6B:
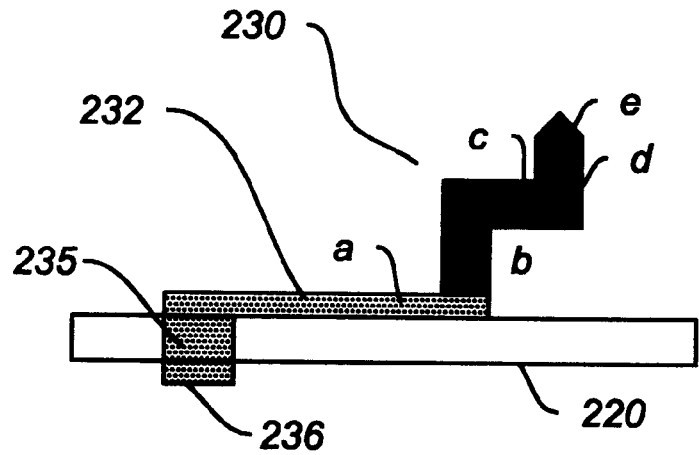
Figure 6C:
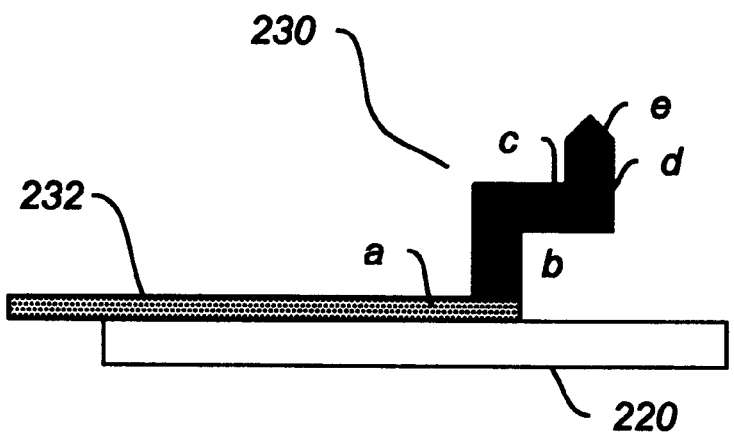

FIGS. 6A–6C provide more detailed views of the contact structure having the contactor 230 on the silicon substrate 220. To establish an interconnection with the probe card or the IC package as noted above, the examples of FIGS. 6A–6C show basic three types of electrical path to form such interconnections. FIG. 6A shows an example in which such an electrical connection is established at the top of the substrate. FIG. 6B shows an example in which an electrical connection is established at the bottom of the substrate while FIG. 6C shows an example in which an electrical connection is formed at the edge of the substrate. Almost any types of existing IC package design or probe card design can accommodate at least one of the interconnect types of FIGS. 6A–6C.

The example of FIG. 6A includes an interconnect trace 232 also designated by a and an interconnect pad 233 on the substrate 220. The interconnect trace 232 establishes an electric path from the contactor 230 to the interconnect pad 233. The example of FIG. 6B includes an interconnect trace 232, an interconnect pad 235 via the substrate 220 and an interconnect pad 236 at the bottom of the substrate 220. In the example of FIG. 6C, the interconnect trace 232 extends to the edge of the substrate 220. In each of the examples, the interconnect trace 232 also functions to fan-out the small pitch of the contactors 230 to a larger pitch to fit to the probe card or IC package.

As shown in each of FIGS. 6A–6C, the contactor 230 has vertical portions b and d and a horizontal beam c and a tip portion e. The tip portion e of the contactor 230 is preferably sharpened to achieve a scrubbing effect when pressed against the contact target 320 requiring penetration through a metal-oxide layer. For example, if the contact target 320 on the wafer 300 has aluminum oxide on its surface, the scrubbing effect is necessary to establish the electric contact with low contact resistance. The spring force of the horizontal beam c provides an appropriate contact force against the contact pad 320. The elasticity produced by the spring force of the horizontal beam c also functions to compensate the differences in size or the fluctuation of flatness involved in the contactors 230, the silicon substrate 220, the contact pad 320 and the semiconductor wafer 300.

An example of material of the contactor 230 includes nickel, aluminum and copper. The tip portion e may be plated by nickel palladium, rhodium, nickel gold, iridium or several other depositable materials. An example of size of the contactor intended for a probe-test application may be 100–400 $\mu$m in overall height, 50–400 $\mu$m in horizontal length, and about 30–60 $\mu$m in thickness for the pitch of 50 $\mu$m between contact targets 320.

FIGS. 7A–7M show an example of process for producing the contact structure of the present invention through a plastic molding (hot embossing) technology. Another example of production process involving a photolithography process using a gray-tone photomask is described with reference to FIGS. 10A–10G. The molding process of FIGS. 7A–7M is especially useful to form a multilevel structure of the contactor in one molding process. For example, the vertical beam and the horizontal beam of the contactor shown in FIGS. 5 and 6 are fabricated at the same time.

In FIG. 7A, a thin metal layer 237 made of copper, for example, is provided on the silicon substrate 220. The metal layer 237 is a seed layer to achieve electrical conductivity for forming the interconnect trace 232 and contactor 230 of FIG. 6 through an electroplating process. If the interconnect trace 232 and contactor 230 are formed through other deposition process such as sputtering, the seed layer 237 is unnecessary.

A plastic layer 242 is formed on the metal layer 237 over which a mold insert 280 is provided to directly form a plating pattern on the plastic layer 242. An example of material for the plastic layer 242 is thermoplastic polymer or thermoplastic resin. The mold insert 280 is made, for example, of steel, copper or nickel. The shape of the mold insert 280 is realized by various methods including electron beam writing, deep UV photoresists, excimer laser ablation, electrodischarge machining, laser cutting, and X-ray lithography. In the example of FIG. 7A, the mold insert 280 has an insert portion at the bottom thereof which has a shape corresponding to the vertical beam and the horizontal beam of the contactor shown in FIGS. 6A–6C.

In the process of FIG. 7B, the mold insert 280 is fully pressed against the polymer layer 242 under the high temperature atmosphere. When the mold insert 280 is removed under the lower temperature, a hollow, i.e., a plating pattern (A), shown in FIG. 7C is created on the plastic layer 242. Such a plating pattern (A) depicts the multilevel structure of the contactor 230 including the vertical and horizontal beams.

FIG. 7D shows a situation where the necessary procedures such as a cleaning process for removing residue and a seed layer forming process as a preparation for a plating process. Thus, a seed layer 239 which is a thin conductive film is formed on the polymer layer 242 as shown in FIG. 7D. Such a cleaning and seed layer forming process may be repeated in a later stage for forming other parts of the contact structure, although descriptions of which will not be not repeated for convenience of explanation.

An electroplating process is performed on the pattern formed by the plastic molding in the foregoing in FIG. 7E, thereby creating the contactor 230 which has beam portions a and b shown in FIGS. 6A–6C. An example of the conductive material for the contactor 230 in the plating processes includes nickel, aluminum and copper. In the next step shown in FIG. 7F, an overplating portion of the contactor 230 is removed and planarized.

In FIG. 7G, a thin metal layer 235 and a plastic (polymer) layer 243 are produced on the planarized surface of FIG. 7F. In FIG. 7H, a mold insert 282 having an insert portion corresponding to the upper vertical beam of the contactor is prepared over the polymer layer 243. The mold insert 282 is pressed into the polymer layer as shown in FIG. 7I under the high temperature environment. When the mold insert 282 is removed under the lower temperature, a plating pattern (B) shown in FIG. 7J is created on the polymer layer 243.

Thus, by applying the plating process again, the vertical beam of the contactor 230 which is a portion c (FIGS. 6A–6C) is created as shown in FIG. 7K. The overplated portion of the contactor 230 in FIG. 7K is removed in the grinding (planarizing) process as shown in FIG. 7L. In FIG. 7M, the polymer layers 242, 243 and the seed layer 235 are stripped off with use of a special solvent. As in the foregoing, the contactor 230 is formed on the silicon substrate 220 by the plastic molding (hot embossing) process. Although only one contactor 230 is shown in the foregoing explanation, a large number of contactors 230 can be produced at the same time by the production process of the present invention.

FIGS. 8A and 8B show the second example of the contact structure of the present invention. In this example, the contact structure has a contactor 530 whose structure is simpler than that of the first example in the foregoing. The contactor 530 is formed on a substrate 520 which is typically a silicon substrate or a dielectric substrate. The contactor 530 is formed of a horizontal beam and a vertical beam where the horizontal beam exerts a spring force when the contactor is pressed against a contact target. A recess 550 is provided on the substrate 520. The recess 550 is positioned under the vertical beam to provide a free space for the contactor 530 to enter therein to exert a contact force when pressed downward in FIGS. 8A and 8B.

In the example of FIG. 8B, an interconnect trace 532 connected to the contactor 530 is also shown to establish interconnection with outer components such as a printed circuit board or an IC package (not shown). Such an interconnection may be directly made between the outer components and the contactor 530 in the example of FIG. 8A. A thin metal layer 537 is shown in FIGS. 8A and 8B which functions as a seed layer for an electroplating process for forming the contactor 530 as will be described later.

In the contact structure of the second example, similar to the example of FIG. 5, a plurality of contactors 530 may be formed on a common substrate, typically a silicon substrate 520. All of the contactors 530 are produced at the same time through the same production processes on the silicon substrate 520. Such a production process includes a photolithography process, a micro-machining process, a plastic mold process (hot embossing), and the like.

The contactors 530 on the silicon substrate 520 can be directly mounted on a probe card such as shown in FIG. 3, or molded in a package, such as a traditional IC package having leads, so that the package is mounted on a probe card. Since the contactors 530 can be fabricated in a very small size, a frequency bandwidth of a probe card mounting the contactors of the present invention can be easily increased to 2 GHz or higher. Because of the small size, the number of contactors on a probe card can be increased to, for example 2,000, thereby being able to test as many as 32 or more memory devices in parallel at the same time.

Furthermore, because the contactors 530 of the present invention are formed on the silicon substrate 520, variations caused by environmental changes such as a temperature expansion ratio of the silicon substrate 520 of the contact structure are the same as those of the semiconductor wafer 300 under test. Therefore, the accurate positioning between the contactors 530 and the contact pads on the wafer 300 can be maintained throughout the test.

An example of material of the contactor 530 includes nickel, aluminum and copper. The tip portion of the contactor 530 may be plated by nickel palladium, rhodium, nickel gold, iridium or several other depositable materials. An example of size of the contactor 530 intended for a probe-test application may be 50–200 $\mu$m in overall height, 50–400 $\mu$m in horizontal length, and about 30–60 $\mu$m in thickness for the pitch of 50 $\mu$m between contact targets.

FIGS. 9A–9J show an example of process for producing the contactors of the present invention in FIG. 8 incorporating a plastic molding process although other processes are also applicable. Another example of production process involving a photolithography process using a gray-tone photomask will be described later with reference to FIGS. 11A–11E.

Figure 9A:
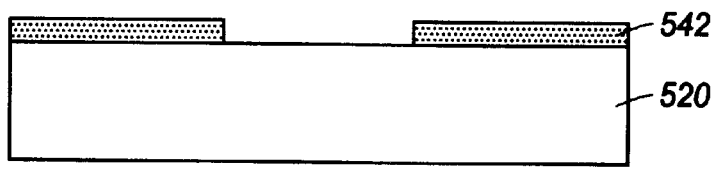
FIGS. 9A–9N are schematic diagrams showing an example of production process using a plastic molding technology for forming the contact structure in FIG. 8A in the present invention.

In FIG. 9A, a photoresist layer 542 is formed on the substrate 520 by a photolithography process. Such a photolithography process includes the steps of photoresist coating, masking, exposure, and photoresist stripping as is well known in the art. Although not shown, a photomask is aligned over the photoresist layer 542 so that the photoresist layer 542 is exposed with ultraviolet light based on the pattern printed on the photomask. If a positive acting photoresist is used, the photoresist covered by the opaque portions of the photo mask is hardened (cured) after the exposure. The exposed part of the resist can be dissolved and washed away, leaving a photomask layer 542 of FIG. 9A which defines an etching area.

Figure 9B:
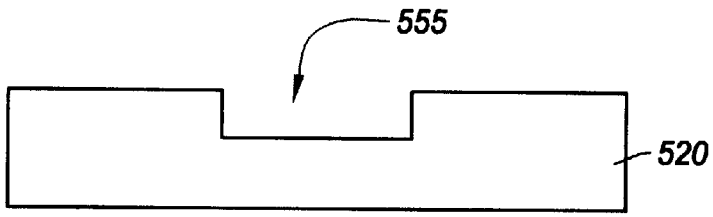
Figure 9C:
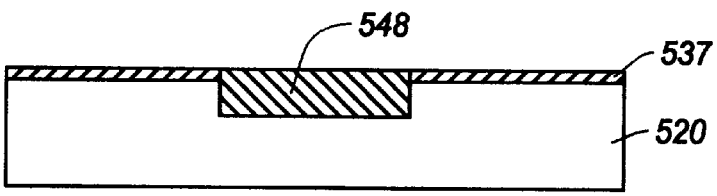

Through an etching process, an indented (groove) portion 555 is created on the substrate 520 as shown in FIG. 9B. The photoresist layer 542 in FIG. 9A is removed with use of a dissolution solvent. In FIG. 9C, a sacrificial part 548 is formed in the indented portion 555 on the substrate 520. The sacrificial part 548 is made, for example, of silicon dioxide ($SiO_2$) through a deposition process such as chemical vapor deposition (CVD). A thin metal layer 537 is formed on the substrate to function as a plating seed layer.

Figure 9D:
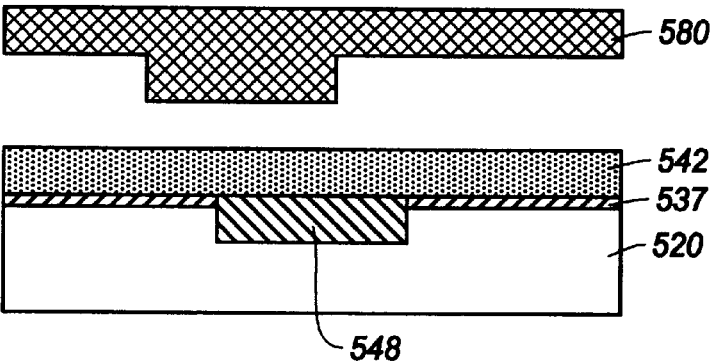

A plastic layer 542 is formed on the metal layer 537 over which a mold insert 580 is provided to directly form a plating pattern on the plastic layer 542. An example of material for the plastic layer 542 includes thermoplastic polymer and thermoplastic resin. The mold insert 580 is made of, for example, steel, copper or nickel. The shape of the mold insert 580 is realized by various methods including electron beam writing, deep UV photoresists, excimer laser ablation, electrodischarge machining, laser cutting, and X-ray lithography. In the example of FIG. 9D, the mold insert 580 has an insert portion at the bottom thereof which has a shape corresponding to the horizontal beam of the contactor 530 shown in FIGS. 8A and 8B.

Figure 9E:
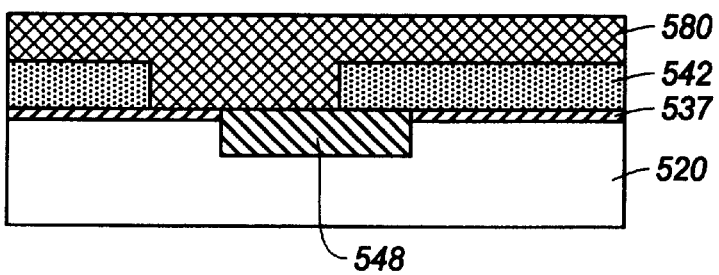
Figure 9F:
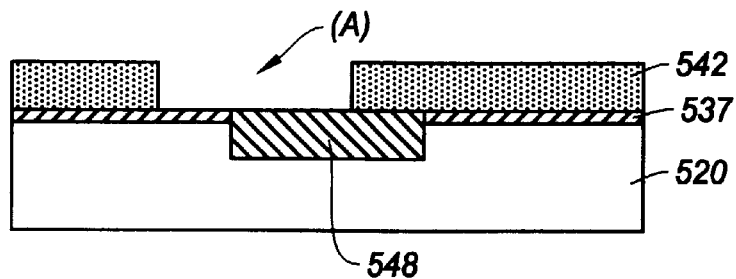

In the process of FIG. 9E, the mold insert 580 is fully pressed against the plastic layer 542 under the high temperature atmosphere. When the mold insert 580 is removed under the lower temperature, a hollow, i.e., a plating pattern (A), shown in FIG. 9F is created on the plastic layer 542. Although not shown, necessary procedures such as a cleaning process for removing residue and a seed layer forming process as a preparation for a plating process.

Figure 9G:
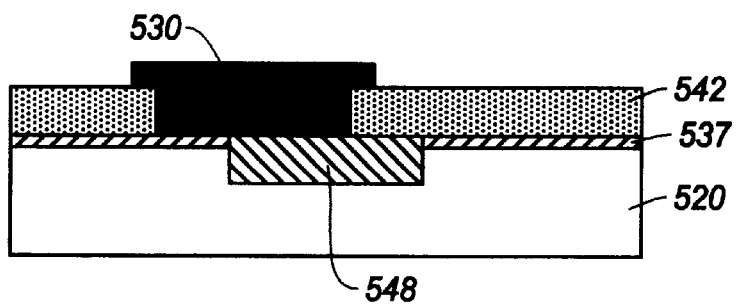

In FIG. 9G, an electroplating process is performed on the plating pattern formed by the plastic molding in the foregoing, thereby creating the contactor 530 which has the horizontal beam. An example of the conductive material for the contactor 530 in the plating processes includes nickel, aluminum and copper. In the next step shown in FIG. 9H, an overplating portion of the contactor 530 is removed and planarized.

Figure 9H:
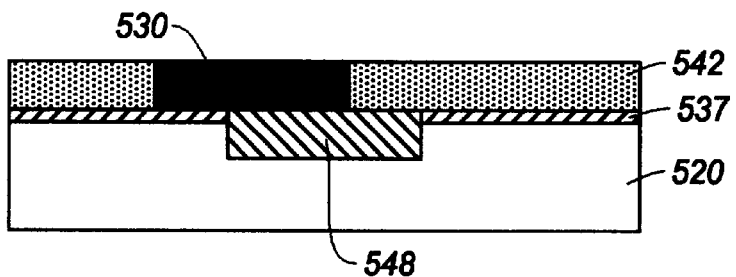
Figure 9I:
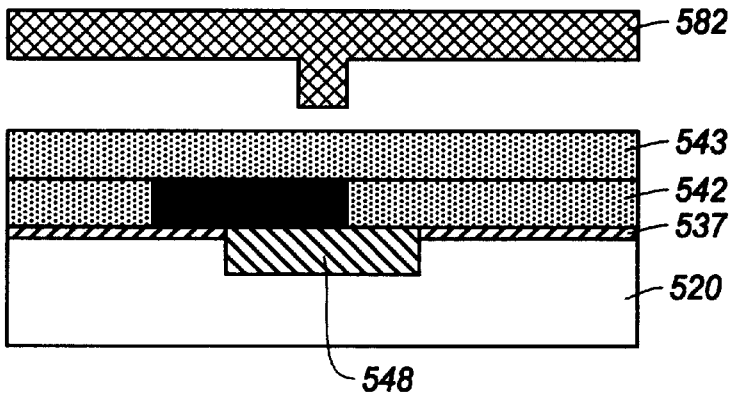
Figure 9J:
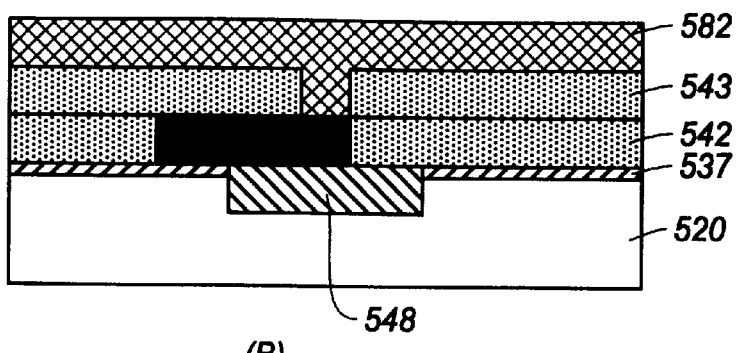
Figure 9K:
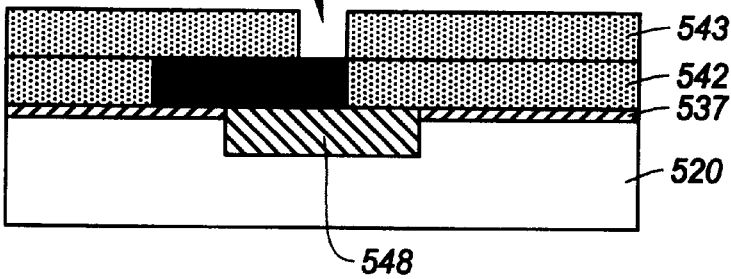

In the process of FIG. 9I, a thin metal (seed) layer and a plastic (polymer) layer 543 are produced on the planarized surface of FIG. 9H. Also in FIG. 9I, a mold insert 582 having an insert portion corresponding to the vertical beam of the contactor 530 is prepared over the plastic layer 543. The mold insert 582 is pressed into the polymer as shown in FIG. 9J under the high temperature environment. When the mold insert 582 is removed in the lower temperature, a plating pattern (B) shown in FIG. 9K is created on the polymer layer 543.

Figure 9L:
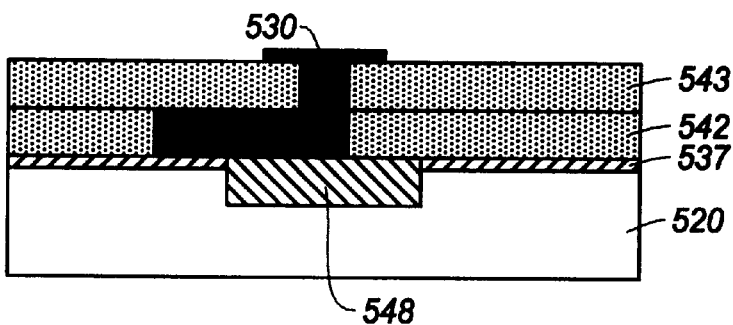
Figure 9M:
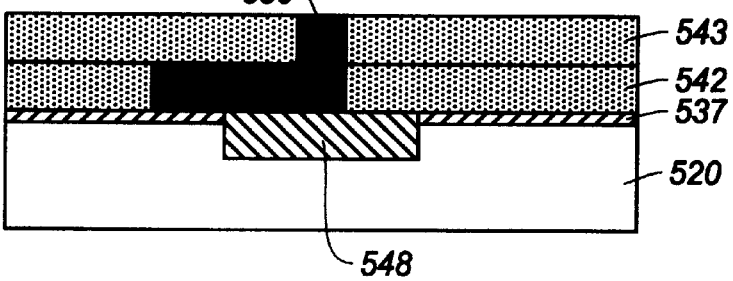
Figure 9N:
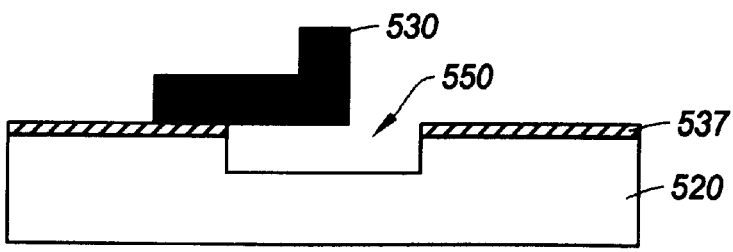

Thus, by applying the plating process again, the vertical beam of the contactor 530 is created as shown in FIG. 9L. The overplated portion of the contactor 530 in FIG. 9L is removed in the grinding (planarizing) process as shown in FIG. 9M. In FIG. 9N, the polymer layers 542 and 543 are stripped off with use of a special solvent. As in the foregoing, the contactor 530 is formed on the silicon substrate 520 by the plastic mold (hot embossing) process. Although only one contactor 530 is shown in the foregoing explanation for the simplicity of explanation, a large number of contactors 530 can be produced at the same time by the production of the present invention.

FIGS. 10A–10G show another example of procedure for producing the contactor of the present invention having the structure shown in FIGS. 5 and 6. The production method in FIGS. 10A–10G involves a photolithography process using a gray-tone photomask. In this invention, a gray-tone photomask is used to form a multilevel structure of the contactor in one exposure process. For example, the base vertical beam and the horizontal beam of the contactor shown in FIGS. 5 and 6 is created by using one photomask.

Figure 10A:
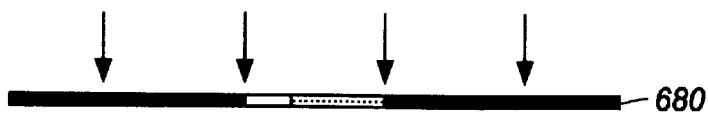
FIGS. 10A–10G are schematic diagrams showing an example of production process of the present invention using a gray-tone photomask for forming the contact structure of FIGS. 5 and 6.

In FIG. 10A, a plating seed (thin metal) layer 637 is formed on the surface of a silicon substrate 620. The silicon substrate 620 is also provided, on the seed layer 637, with a photoresist layer 642. The photoresist layer 642 has a relatively larger thickness to accommodate a plating pattern therein corresponding to the vertical and horizontal beams of a contactor 630 shown in FIG. 10G. In this example, the photoresist 642 is positive resist.

A photomask 680 is positioned over the photoresist layer 642 for UV light exposure. The photomask 680 includes not only transparent and opaque portions but intermediate (semi-transparent or gray) portions as well. The photoresist which is not exposed with the UV light because of the opaque (black) portion of the mask 680 is cured. The photoresist which is exposed with the UV light because of the transparent (white) portion of the mask 680 is uncured. The photoresist which is insufficiently exposed with the UV light because of the semi-transparent (gray) portion of the mask is cured at the lower part but uncured at the upper part.

Figure 10B:
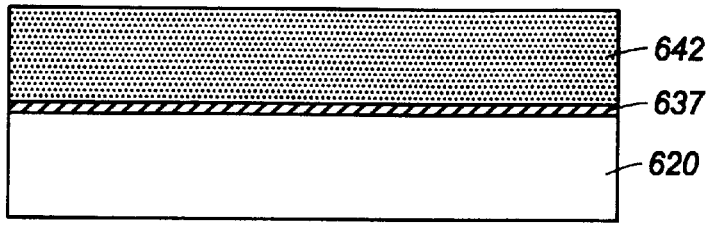
Figure 10C:
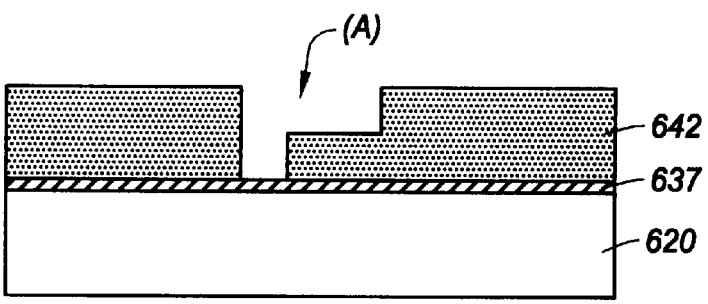

Thus, when the uncured photoresist is removed, a plating pattern (A) shown in FIG. 10B is created. By applying the electroplating process for the plating pattern (A) of FIG. 10B, and planarizing an overplating portion, the vertical and horizontal beams of the contactor 630 are formed as shown in FIG. 10C. An example of the conductive material for the contactor 630 in the plating process includes nickel, aluminum and copper.

Figure 10D:
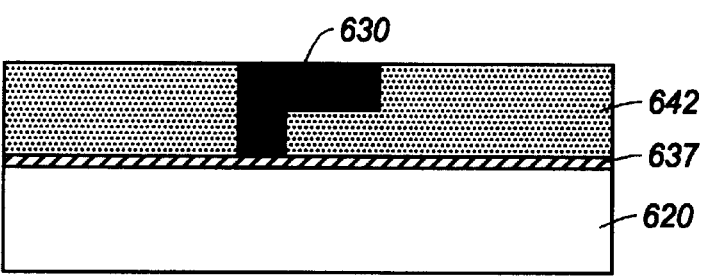
Figure 10E:
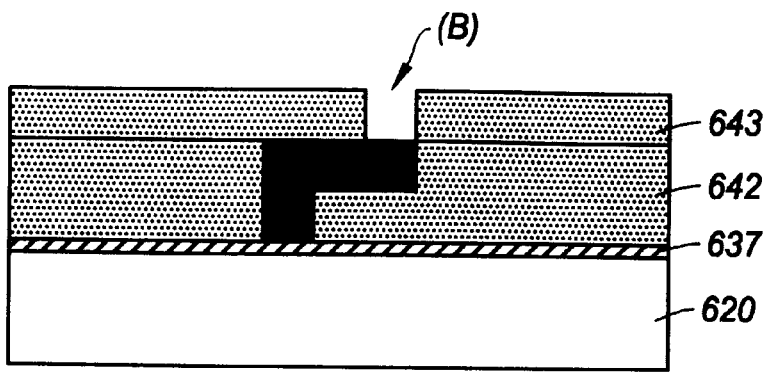
Figure 10F:
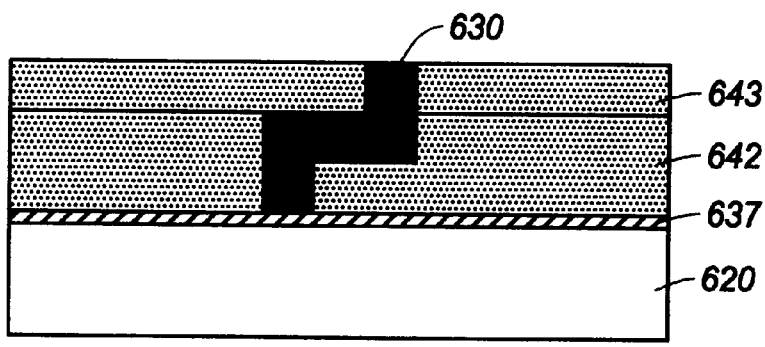
Figure 10G:
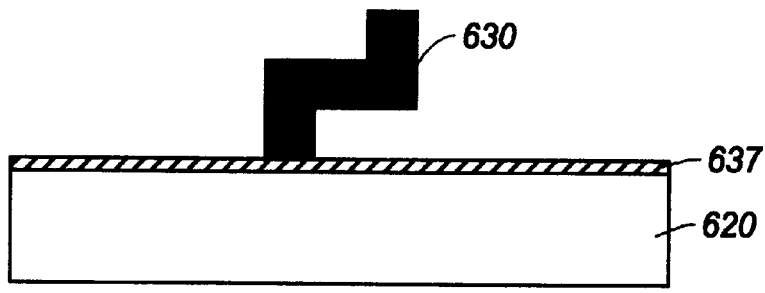

FIGS. 10D–10F show the next photolithography process in which the upper vertical beam of the contactor 630 is formed on the horizontal beam. In FIG. 10D, a thin metal layer (not shown) and a photoresist layer 643 are provided on the surface planarized in the process of FIG. 10C. A photomask 682 is aligned over the photoresist layer 643 through which the photoresist is exposed with the UV light. By removing the uncured resist, a plating pattern (B) shown in FIG. 10E is created. In FIG. 10F, the upper vertical beam of the contactor 630 is produced by plating the pattern (B). By removing the photoresist layers 642 and 643, the contactor 630 shown in FIG. 10G is fabricated on the substrate 620. In the foregoing, although only one contactor 630 is shown in the foregoing explanation, a large number of contactors 630 can be produced at the same time by the production of the present invention.

Similar to the production process of FIGS. 10A–10G, an example of procedure for producing the contactor having the structure shown in FIGS. 8A and 8B by the photolithography using the gray-tone photomask is shown in FIG. 11A–11E. As noted above, the gray-tone mask is used to form a multilevel structure of the contactor in one exposure process. In the example of FIGS. 11A–11E, the whole structure of the contactor shown in FIGS. 8A and 8B (also FIG. 11E) is created by using one photomask.

Figure 11A:
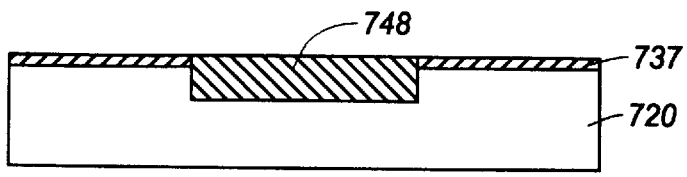
FIGS. 11A–11E are schematic diagrams showing an example of production process of the present invention using a gray-tone photomask for forming the contact structure in FIGS. 8A and 8B.
Figure 11B:
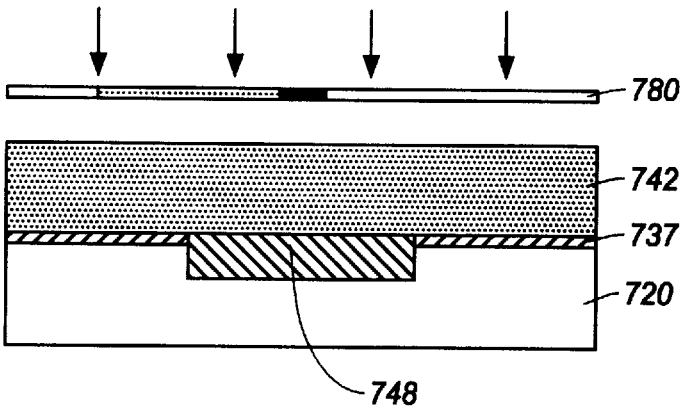

In FIG. 11A, a plating seed (thin metal) layer 737 and a sacrificial part 748 are formed on the surface of a silicon substrate 720 by the process described in FIGS. 9A–9C. On the seed layer 737, the silicon substrate 720 is also provided with a photoresist layer 742. The photoresist layer 742 has a sufficient thickness to accommodate a plating pattern therein corresponding to the overall height of the contactor 530 shown in FIGS. 8A and 8B (730 in FIG. 11E). In this example, the photoresist 642 is negative resist.

A photomask 780 is positioned over the photoresist layer 742 for the UV light exposure. The photomask 780 is a gray-tone photomask including transparent, opaque and semi-transparent (gray) portions. The photoresist which is exposed with the UV light because of the transparent (white) portion of the mask 780 is cured. The photoresist which is not exposed with the UV light because of the opaque (black) portion of the mask 780 is uncured. The photoresist which is insufficiently exposed with the UV light because of the semi-transparent (gray) portion of the mask 780 is cured at the upper part but uncured at the lower part.

Figure 11C:
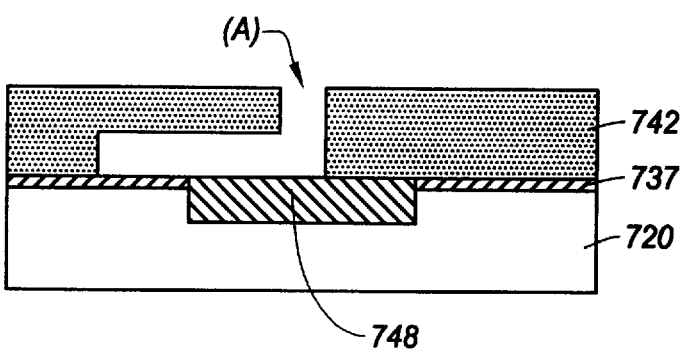
Figure 11D:
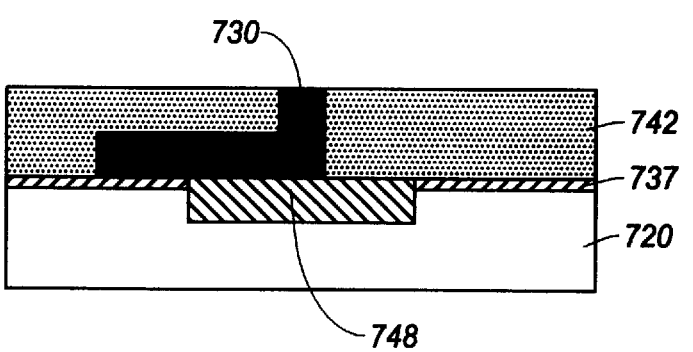
Figure 11E:
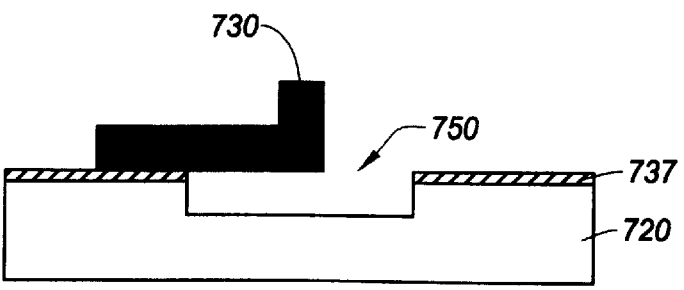

Thus, when the uncured photoresist is removed, a plating pattern (A) shown in FIG. 11C is created. By applying the electroplating process for the plating pattern (A) of FIG. 11C and planarizing an overplating portion, the contactor 730 having the horizontal and vertical beams is formed as shown in FIG. 11D. An example of the conductive material for the contactor 730 in the plating process includes nickel, aluminum and copper. By removing the photoresist layer 742 and the sacrificial part 748, the contactor 730 shown in FIG. 11E is fabricated on the substrate 720. A hollow (indented portion) 750 of FIG. 11E functions as a recess when the contactor 730 is pressed against a contact target and bent backward. In the foregoing, although only one contactor 730 is shown in the foregoing explanation, a large number of contactors 730 can be produced at the same time by the production of the present invention.

According to the present invention, the contact structure has a very high frequency bandwidth to meet the test requirements of next generation semiconductor technology. Since the contact structure is formed through a modern miniaturization technology used in the semiconductor production process, a large number of contactors can be aligned in a small space which is suitable for testing a large number of semiconductor devices at the same time. The contact structure of the present invention can also be used in more general applications including an IC lead, IC packaging, and other electrical connections.

Since the large number of contactors are produced at the same time on the substrate with the use of the microfabrication technology without involving manual handling, it is possible to achieve consistent quality, high reliability and long life in the contact performance. Further, because the contactors can be fabricated on the same substrate material as that of the device under test, it is possible to compensate the temperature expansion coefficient of the device under test, which is able to avoid positional errors.

Although only a preferred embodiment is specifically illustrated and described herein, it will be appreciated that many modifications and variations of the present invention are possible in light of the above teachings and within the purview of the appended claims without departing the spirit and intended scope of the invention.

What is claimed is:

1. A method of producing a contact structure having a contactor for achieving an electrical connection with a contact target, comprising the steps of:

providing a substrate having a planar surface thereon;

forming a plastic layer on the planar surface of the substrate;

positioning a mold insert over the plastic layer, the mold insert having a shape representing at least a part of the contactor to be formed on the substrate;

pressing the mold insert into the plastic layer in a high temperature environment;

removing the mold insert from the plastic layer in a low temperature environment to form a plating pattern transferred from the mold insert on the plastic layer;

electroplating the plating pattern on the plastic layer to form the contactor;

repeating the steps of mold insert pressing and removing for other mold insert for forming a remaining portion of the contactor; and removing one or more plastic layers from the substrate;

wherein the contactor has a horizontal portion and a contact portion vertically formed on one end of the horizontal portion, and the horizontal portion produces a contact force when the contactor is pressed against the contact target.

2. A method of producing a contact structure as defined in claim 1, the substrate is a dielectric substrate or a silicon substrate.

3. A method of producing a contact structure as defined in claim 1, wherein the contactor is made of conductive metal formed by the electroplating step.

4. A method of producing a contact structure as defined in claim 1, wherein the contactor further includes a base portion between the substrate and the horizontal portion, the base portion being a vertical beam supporting the horizontal portion and contact portion of the contactor.

5. A method of producing a contact structure as defined in claim 1, wherein the plastic layer is made of thermoplastic polymer or thermoplastic resin.

6. A method of producing a contact structure having a contactor for achieving an electrical connection with a contact target, comprising the steps of:

providing a substrate having a planar surface thereon;

forming a groove on the planar surface of the substrate and filling in the groove with a sacrificial material;

forming a plastic layer on the sacrificial material and the planar surface of the substrate;

positioning a mold insert over the plastic layer, the mold insert having a shape representing at least a part of the contactor to be formed on the substrate;

pressing the mold insert into the plastic layer in a high temperature environment;

removing the mold insert from the plastic layer in a low temperature environment to form a plating pattern transferred from the mold insert on the plastic layer;

electroplating the plating pattern on the plastic layer to form the contactor; and removing the plastic layer and the sacrificial material from the substrate;

wherein the contactor has a horizontal portion and a contact portion vertically formed on one end of the horizontal portion, and the horizontal portion produces a contact force when the contactor is pressed against the contact target.

7. A method of producing a contact structure as defined in claim 6, the substrate is a dielectric substrate or a silicon substrate.

8. A method of producing a contact structure as defined in claim 6, wherein the contactor is made of conductive metal formed by the electroplating step.

9. A method of producing a contact structure as defined in claim 6, wherein the plastic layer is made of thermoplastic polymer or thermoplastic resin.

10. A method of producing a contact structure as defined in claim 6, wherein the sacrificial material on the substrate is made of silicon dioxide and is removed from the substrate after forming the contactor to create a recess below the contactor.

11. A method of producing a contact structure having a contactor for achieving an electrical connection with a contact target, comprising the steps of:

providing a substrate having a planar surface thereon;

forming a photoresist layer on the planar surface of the substrate;

positioning a photomask over the photoresist layer, the photomask having a pattern representing at least a part of the contactor expressed by transparent portions, opaque portions and semi-transparent portions;

exposing the photoresist layer with light and removing uncured parts of the photoresist to form a plating pattern on the photoresist layer transferred from the photomask;

electroplating the plating pattern on the photoresist layer to form the contactor;

repeating the above procedure for forming a remaining part of the contactor; and removing one or more photoresist layers from the substrate;

wherein the contactor has a horizontal portion and a contact portion vertically formed on one end of the horizontal portion, and the horizontal portion produces a contact force when the contactor is pressed against the contact target.

12. A method of producing a contact structure as defined in claim 11, the substrate is a dielectric substrate or a silicon substrate.

13. A method of producing a contact structure as defined in claim 11, wherein the contactor is made of conductive metal formed by the electroplating step.

14. A method of producing a contact structure as defined in claim 11, wherein the contactor further includes a base portion between the substrate and the horizontal portion, the base portion being a vertical beam supporting the horizontal portion and contact portion of the contactor.

15. A method of producing a contact structure having a contactor for achieving an electrical connection with a contact target, comprising the steps of:

providing a substrate having a planar surface thereon;

forming a groove on the planar surface of the substrate and filling in the groove with a sacrificial material;

forming a photoresist layer on the sacrificial material and the planar surface of the substrate;

positioning a photomask over the photoresist layer, the photomask having a pattern representing the contactor expressed by transparent portions, opaque portions and semi-transparent portions;

exposing the photoresist layer with light and removing uncured parts of the photoresist to form a plating pattern on the photoresist layer transferred from the photomask;

electroplating the plating pattern on the plastic layer to form the contactor; and removing the photoresist layer and the sacrificial material from the substrate;

wherein the contactor has a horizontal portion and a contact portion vertically formed on one end of the horizontal portion, and the horizontal portion produces a contact force when the contactor is pressed against the contact target.

16. A method of producing a contact structure as defined in claim 15, the substrate is a dielectric substrate or a silicon substrate.

17. A method of producing a contact structure as defined in claim 15, wherein the contactor is made of conductive metal formed by the electroplating step.

18. A method of producing a contact structure as defined in claim 15, wherein the sacrificial material on the substrate is made of silicon dioxide and is removed from the substrate after forming the contactor to create a recess below the contactor.

* * * * *